(12) United States Patent
Yamada et al.

(10) Patent No.: US 8,503,134 B2
(45) Date of Patent: Aug. 6, 2013

(54) WIRING SUBSTRATE WITH A TORSION RESTRICTOR FOR A TERMINAL

(75) Inventors: Yukie Yamada, Kanagawa (JP); Naoki Yamaguchi, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/530,447

(22) Filed: Jun. 22, 2012

(65) Prior Publication Data

US 2013/0010392 A1    Jan. 10, 2013

(30) Foreign Application Priority Data

Jul. 4, 2011 (JP) .................................. 2011-148608

(51) Int. Cl.
*H05K 1/14* (2006.01)

(52) U.S. Cl.
USPC ....................................... 360/245.9; 174/254

(58) Field of Classification Search
USPC ... 360/245.9; 174/250, 254, 255, 258; 29/846
See application file for complete search history.

(56) References Cited

U.S. PATENT DOCUMENTS

| | | | | |
|---|---|---|---|---|
| 6,388,201 | B2 * | 5/2002 | Yamato et al. | 174/255 |
| 6,420,659 | B1 * | 7/2002 | Tsutsumi et al. | 174/254 |
| 7,872,200 | B2 * | 1/2011 | Yokai et al. | 174/254 |
| 2012/0211263 | A1 * | 8/2012 | Mizutani | 174/250 |

FOREIGN PATENT DOCUMENTS

| | | |
|---|---|---|
| JP | 2003-031915 | 1/2003 |
| JP | 2011029460 | * 2/2011 |
| JP | 2011198402 | * 10/2011 |

* cited by examiner

*Primary Examiner* — Angel Castro
(74) *Attorney, Agent, or Firm* — Jordan and Hamburg LLP

(57) ABSTRACT

A wiring substrate comprises a conductor pattern embedded in an insulating layer, the insulating layer having an opening to expose top and bottom faces of the conductor pattern and define a terminal of the wiring substrate, a torsion restrictor formed in the conductor pattern at a location passing over an edge of the opening, the torsion restrictor restricting torsion of the terminal, and an easily extensible part formed on at least one of the torsion restrictor and a portion of the terminal adjoining the torsion restrictor, the easily extensible part allowing the conductor pattern to longitudinally extend toward the opening.

8 Claims, 6 Drawing Sheets

WIRING SUBSTRATE WITH A TORSION RESTRICTOR FOR A TERMINAL

BACKGROUND OF THE INVENTION

1. Field of the Invention

The present invention relates to a wiring substrate such as a flexure that provides a head suspension incorporated in a hard disk drive with wiring.

2. Description of Related Art

Due to the widely spreading Internet and surging information, recent personal computers are required to process a large amount of data at high speed and hard disk drives incorporated in the personal computers are required to increase storage capacity and data transmission speed. Accordingly, a head suspension to write and read data to and from a disk in the hard disk drive must employ a highly functional flexure.

The flexure generally includes read wiring, write wiring, and a terminal on a tail part to be connected to a main circuit board.

To connect the terminal of the flexure to the main circuit board, there are roughly two techniques. One technique forms flying leads at the terminal of the flexure and joins the flying leads to external terminal pads of the main circuit board with the use of ultrasonic bonding. The other technique forms pads at the terminal of the flexure and joins the pads to the external terminal pads of the main circuit board with the use of a conductive bonding material.

In the case of the flying leads, an opening is formed in an insulating layer of the flexure, to partly expose the top and bottom faces of the read and write wiring embedded in the insulating layer. The exposed sections of the read and write wiring serve as the flying leads that are joined to the external terminal pads of the main circuit board with the use of ultrasonic bonding.

The flying leads are thin and narrow, and therefore, are low in physical strength. To enhance the strength of the flying leads, Japanese Unexamined Patent Application Publication No. 2003-31915 discloses a technique of providing the flying leads with a wide reinforcing section.

Simply providing the flying lead with the wide reinforcing section may prevent a break of the flying lead but may deteriorate the extensibility of the flying lead and decrease reliability of bonding such as bonding strength and connectivity when the flying lead is joined to an external terminal of an external circuit board with ultrasonic bonding.

This problem results in limiting the width of the wide reinforcing section provided for the flying lead. Therefore, the flying lead may twist to deteriorate reliability of bonding between the flying lead and the external terminal to which the flying lead is joined with ultrasonic bonding.

SUMMARY OF THE INVENTION

To solve the problems of the related art, the present invention provides a wiring substrate capable of securing extensibility of flying leads, suppressing a torsion of the flying leads during a bonding process to an external terminal, and improving reliability of bonding between the flying leads and the external terminal.

According to an aspect of the present invention, there is provided a wiring substrate including a conductor pattern embedded in an insulating layer, the insulating layer having an opening to expose top and bottom faces of the conductor pattern and define a terminal of the wiring substrate, a torsion restrictor formed in the conductor pattern at a location passing over an edge of the opening, the torsion restrictor restricting torsion of the terminal, and an easily extensible part that is formed on at least one of the torsion restrictor and a portion of the terminal adjoining the torsion restrictor, the easily extensible part allowing the conductor pattern to extend toward the opening in a longitudinal direction.

According to this aspect of the present invention, the torsion restrictor restricts flying lead, which is the terminal exposed in the opening, from twisting when the flying lead is connected to an external terminal. The easily extensible part allows the conductor pattern to extend when the flying lead is connected to the external terminal, thereby improving reliability of bonding between the flying leads and the external terminal.

DETAILED DESCRIPTION OF EMBODIMENTS

Wiring substrates according to embodiments of the present invention will be explained. The wiring substrate of each embodiment employs a torsion restrictor and an easily extensible part, to secure extensibility of a flying lead of a terminal of the wiring substrate, suppress torsion of the flying lead when it connected to an external terminal, and improve reliability of bonding such as bonding strength and connectivity between the flying lead and the external terminal.

Figure 1:
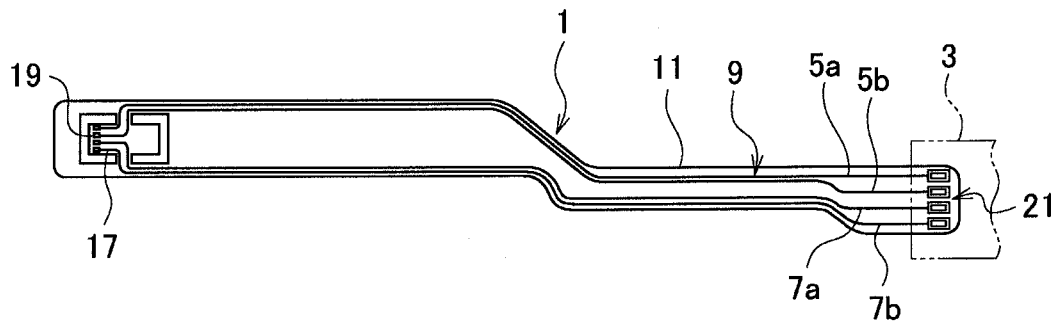
FIG. 1 is a plan view illustrating an example of a basic structure of a flexure according to embodiments.

First, a basic structure of a flexure according to the embodiments will be explained as an example of a wiring substrate to which the present invention is applied. FIG. 1 is a plan view illustrating the flexure, FIG. 2 is a plan view illustrating a terminal portion of the flexure, and FIG. 3 is a sectional view illustrating the terminal portion.

Figure 2:
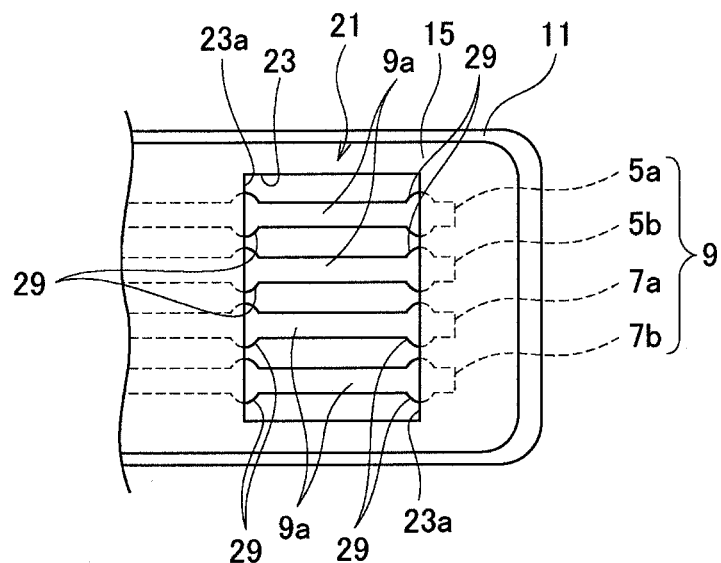
FIG. 2 is a plan view illustrating a terminal portion of the flexure of FIG. 1.
Figure 3:
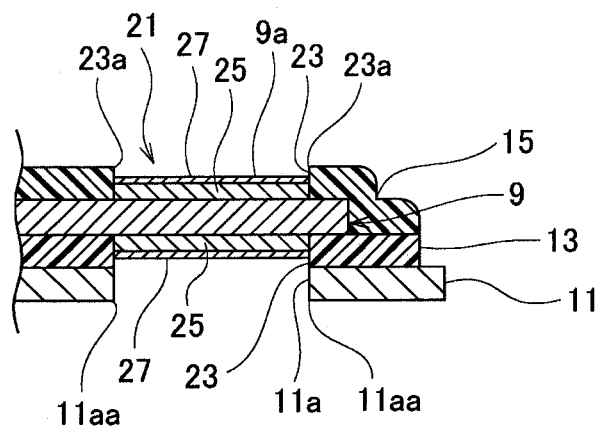
FIG. 3 is a sectional view illustrating the terminal portion of FIG. 2.

In FIGS. 1 to 3, the flexure 1 as a wiring substrate is a part of a head suspension and supports a magnetic head (not illustrated) to write and read data to and from a hard disk in a hard disk drive of, for example, a personal computer.

The flexure 1 has a wiring pattern 9 that includes wires 5a, 5b, 7a, and 7b to connect the magnetic head to an external write/read circuit board 3.

The flexure 1 has a support layer 11 that is made of metal such as stainless steel and is longitudinally extended, an insulating base layer 13 formed on the support layer 11, the wiring pattern 9 formed on the base layer 13, and an insulating cover layer 15 formed over the wiring pattern 9.

Namely, the wiring pattern 9 is embedded between the base and cover layers 13 and 15 that are insulating layers and are supported with the support layer 11 made of a stainless-steel thin plate.

A front end of the support layer 11 has a tongue 17 where a head connection terminal portion 19 is formed. The head connection terminal portion 19 is used to connect the wiring pattern 9 to the magnetic head. A rear end of the support layer 11 has an external connection terminal portion 21 that is used to connect the wiring pattern 9 to the external circuit board 3.

The external connection terminal portion 21 has an opening 23 where top and bottom faces of the wiring pattern 9 are exposed to form flying leads 9a as terminals. The opening 23 corresponds to a window 11a formed in the support layer 11.

In this example, the top and bottom faces of the wiring pattern 9 exposed in the opening 23 are provided with a plated nickel layer 25 and a plated gold layer 27.

At the external connection terminal portion 21, the wiring pattern 9 has wide parts 29 for the flying leads 9a, respectively. Each wide part 29 is wider than the flying lead 9a and passes over an edge 23a of the opening 23.

The wide parts 29 improve physical strength of the wiring pattern 9 at the edge 23a of the opening 23.

When the flying leads 9a at the external connection terminal portion 21 are connected to external terminals of the circuit board 3 by applying ultrasonic waves with a bonding tool, the wide parts 29 prevents the flying leads 9a from breaking even if bonding stress concentrates on the flying leads 9a along the edge 23a of the opening 23, thereby improving reliability of the bonding.

The wide parts 29, however, deteriorate extensibility of the flying leads 9a and lower the reliability of the bonding such as bonding strength and connectivity between the flying leads 9a and the external terminal of the circuit board 3 when they are connected to each other with ultrasonic waves. The width of each wide part 29, therefore, must be limited. This limitation results in causing a twist of the flying leads 9a when connecting them to the external terminal of the circuit board 3 with ultrasonic waves and deteriorating reliability of bonding between the flying leads 9a and the circuit board 3.

The present invention solves the problems of the basic structure.

Figure 4:
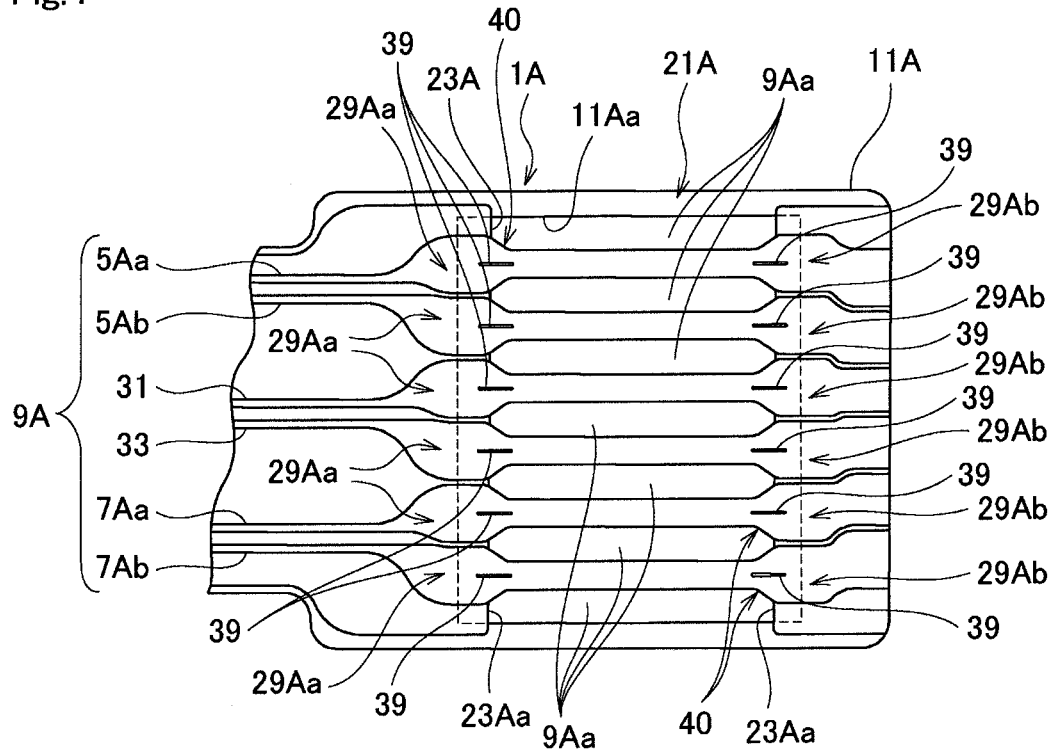
FIG. 4 is a plan view illustrating a terminal portion of a flexure according to a first embodiment of the present invention with a conductor pattern being exposed.

A first embodiment of the present invention will be explained with reference to FIGS. 4 and 5. FIG. 4 is a plan view illustrating a terminal portion of a flexure with a conductor pattern being exposed and FIG. 5 is a plan view illustrating the conductor pattern of FIG. 4.

Figure 5:
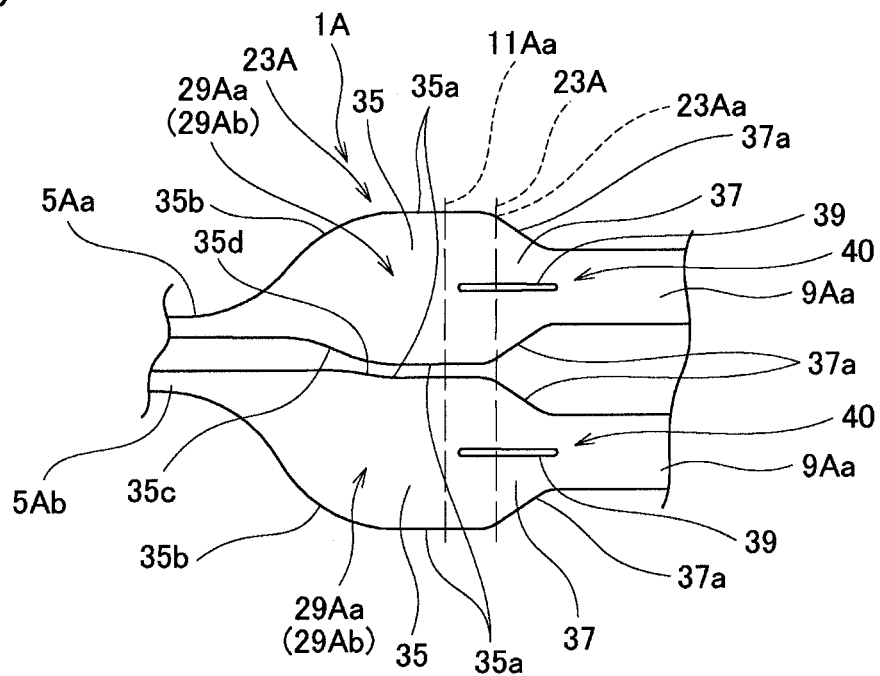
FIG. 5 is a plan view illustrating the conductor pattern of FIG. 4.

The flexure 1A according to the first embodiment has the basic structure of the flexure 1 illustrated in FIG. 1, and therefore, like parts are represented with like reference numerals plus "A" in FIGS. 4 and 5 to omit overlapping explanations. At a rear end, the flexure 1A as a wiring substrate has a terminal portion 21A to be connected to an external circuit board. The terminal portion 21A according to the first embodiment is applicable to other flexure with other basic structure.

The flexure 1A has a support layer 11A that is a thin plate made of metal such as stainless steel and is longitudinally extended, an insulating base layer 13A formed on the support layer 11A, a wiring pattern 9A as a conductor pattern formed on the base layer 13A, and an insulating cover layer (not illustrated) formed over the wiring pattern 9A. Namely, the wiring pattern 9A is embedded between the base layer 13A and the cover layer.

The wiring pattern 9A includes wires 5Aa, 5Ab, 7Aa, and 7Ab to be connected to a read/write circuit board and other wires such as a sensor wire 31 and heater wire 33.

The terminal portion 21A has an opening 23A where top and bottom faces of the wiring pattern 9A are exposed to form flying leads 9Aa as terminals. The opening 23A corresponds to a window 11Aa formed in the support layer 11A.

The top and bottom faces of the wiring pattern 9A exposed in the opening 23A may be provided with a plated nickel layer and a plated gold layer like the basic structure illustrated in FIG. 3.

The wiring pattern 9A is provided with torsion restrictors 29Aa and 29Ab at locations where the wiring pattern 9A crosses an edge 23Aa of the opening 23A. In FIG. 5, only one torsion restrictor 29Aa is indicated and the other torsion restrictor 29Ab is indicated in parentheses for the sake of convenience. The same shall apply other embodiments. The torsion restrictor 29Aa (29Ab) is wider than the flying lead 9Aa whose top and bottom faces are exposed in the opening 23A between the torsion restrictors 29Aa and 29Ab.

Each torsion restrictor 29Aa (29Ab) has a wide part 35 and a linking part 37.

The wide part 35 is defined with linear parallel sides 35a and has a constant width that is wider than the flying lead 9Aa. The wide part 35 reinforces the flying lead 9Aa and restricts the flying lead 9Aa from twisting. The width of the wide part 35 is not always necessary to be constant. The wide part 35 is continuous through curved sides 35b and 35c to the wire 5Aa (7Aa, 31), or through curved sides 35b and 35d to the wire 5Ab (7Ab, 33).

The linking part 37 links the flying lead 9Aa and wide part 35 to each other and has linearly inclined sides 37a so that the linking part 37 gradually widens from the flying lead 9Aa toward the wide part 35. From the flying lead 9Aa to the inclined sides 37a, smooth curves are formed to avoid stress concentration. At the edge 23Aa of the opening 23A, the inclined sides 37a are continuous to the parallel sides 35a.

The linking part 37 provides a reinforcing function and a torsion restricting function. The linearly inclined sides 37a of the linking part 37 may be curved sides.

The torsion restrictor 29Aa (29Ab) has a slit 39 to form an easily extensible part 40. The slit 39 is longitudinally formed through and along the torsion restrictor 29Aa (29Ab) to mainly split the linking part 37 in a lateral direction orthogonal to a longitudinal direction of the wiring pattern 9A so that the torsion restrictor 29Aa (29Ab) may easily extend toward the opening 23A. The slit 39 is not limited to that formed through the torsion restrictor 29Aa (29Ab) if the slit 39 properly separates the linking part 37 so that the torsion restrictor 29Aa (29Ab) may easily extend toward the opening 23A. The slit 39 is aligned with a lateral or widthwise center of each flying lead 9Aa and linearly extends in parallel with the flying lead 9Aa. A first end of the slit 39 slightly enters the region of the flying lead 9Aa that is a part adjoining the torsion restrictor 29Aa (29Ab) and a second end thereof slightly enters the region of the wide part 35. The length of the slit 39 is optional.

When the flying leads 9Aa are connected to external terminals of an external circuit board (not illustrated) by applying ultrasonic waves with a bonding tool, torsional torque onto the flying leads 9Aa is borne with the linking parts 37 and the edge 23Aa of the opening 23A and is simultaneously dispersed to the wide parts 35.

Such transfer and dispersion of the torsional torque prevents the flying leads 9Aa from being twisted, thereby securing reliability of the bonding such as bonding strength and connectivity between the flying leads 9Aa and the circuit board.

Stress occurring at each linking part 37 at the edge 23Aa of the opening 23A is transferred from the linking part 37 to the wide part 35 without concentration. Namely, the stress is dispersed to the wide part 35.

Such transfer and dispersion of stress effectively prevents the flying leads 9Aa from breaking when they are connected to the circuit board, thereby improving reliability of bonding between the flying leads 9Aa and the circuit board.

The slit 39 spanning between the regions of the flying lead 9Aa and the wide part 35 splits the widthwise continuity of the wide part 35 so that a part between the flying lead 9Aa and the wide part 35 may easily extend when the flying leads 9Aa are connected to external terminals of the circuit board with ultrasonic waves, thereby securing reliability of the bonding between them.

Figure 6:
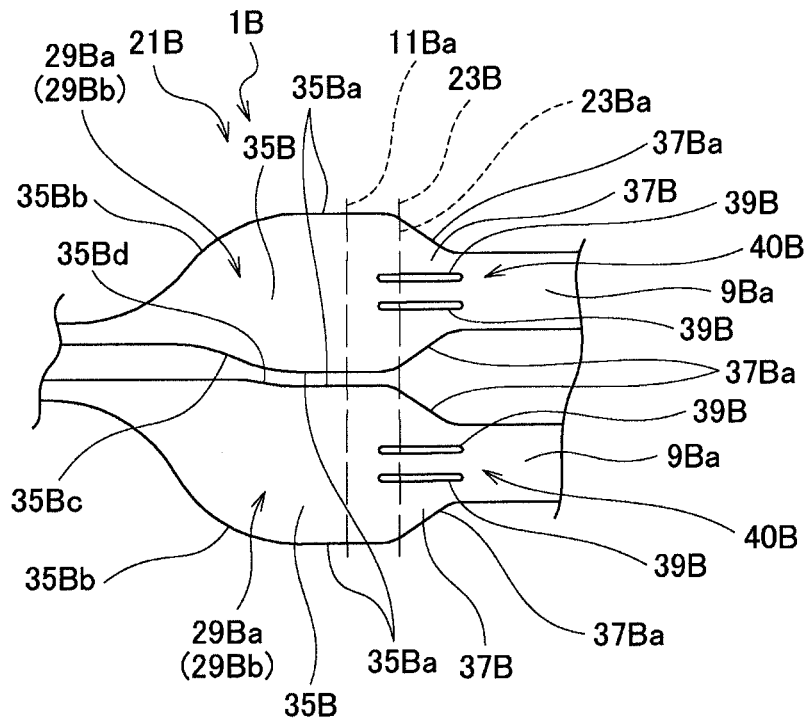
FIG. 6 is a plan view illustrating a conductor pattern at a terminal portion of a flexure according to a second embodiment of the present invention.

A second embodiment of the present invention will be explained with reference to FIG. 6. FIG. 6 is a plan view illustrating a conductor pattern at a terminal portion of a flexure. The second embodiment is similar to the first embodiment, and therefore, like parts are represented with like reference numerals plus "B" in FIG. 6 instead of "A" of FIG. 5 to omit overlapping explanations.

According to the second embodiment, the flexure 1B has an easily extensible part 40B including two slits 39B that are parallel to each other and are positioned so as to equally divide the width of a flying lead 9Ba into three. The length of the slits 39B is optional.

The second embodiment allows a part between the flying lead 9Ba and a wide part 35B to more easily extend, thereby improving reliability of bonding between the flying leads 9Ba and external terminals of an external circuit board when they are connected to each other with ultrasonic waves.

In addition, the second embodiment provides the same effects as the first embodiment.

Figure 7:
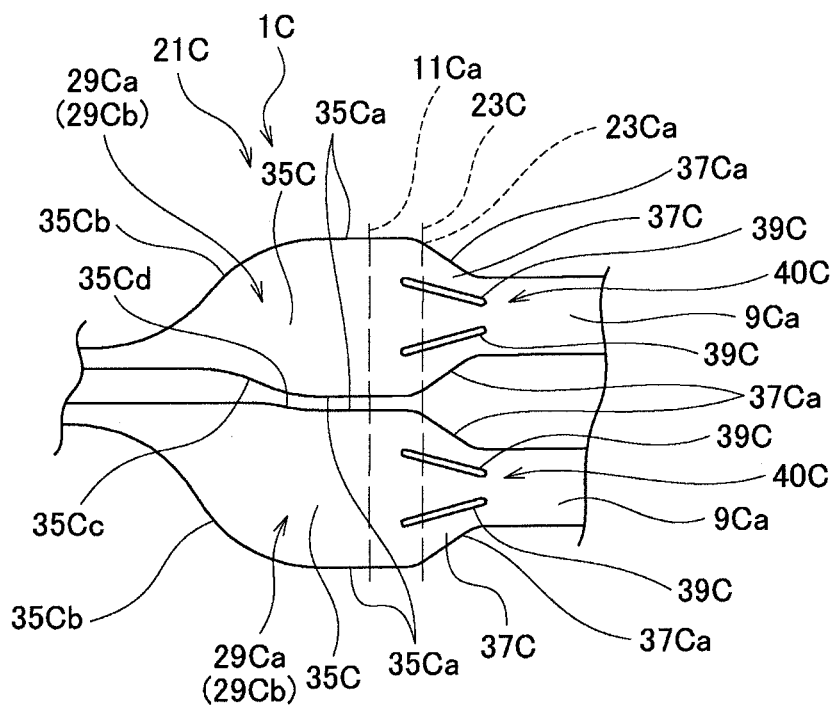
FIG. 7 is a plan view illustrating a conductor pattern at a terminal portion of a flexure according to a third embodiment of the present invention.

A third embodiment of the present invention will be explained with reference to FIG. 7. FIG. 7 is a plan view illustrating a conductor pattern at a terminal portion of a flexure. The third embodiment is similar to the second embodiment, and therefore, like parts are represented with like reference numerals plus "C" in FIG. 7 instead of "B" of FIG. 6 to omit overlapping explanations.

According to the third embodiment, the flexure 1C has an easily extensible part 40C including two linear slits 39C that are inclined so that first ends thereof equally divide the width of a flying lead 9Ca into three and second ends thereof nearly equally divide a wide part 35C into three. The length of the slits 39C is optional.

The third embodiment allows a part between the flying lead 9Ca and the wide part 35C to easily extend, thereby improving reliability of bonding between the flying leads 9Ca and external terminals of an external circuit board when they are connected to each other with ultrasonic waves.

In addition, the third embodiment provides the same effects as the second embodiment.

Figure 8:
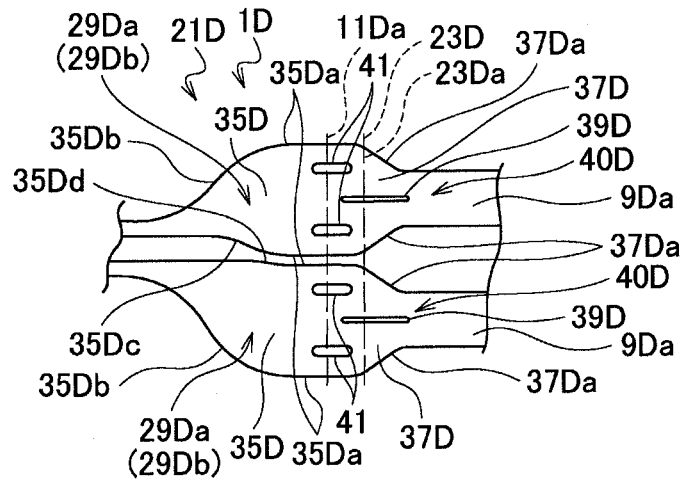
FIG. 8 is a plan view illustrating a conductor pattern at a terminal portion of a flexure according to a fourth embodiment of the present invention.

A fourth embodiment of the present invention will be explained with reference to FIG. 8. FIG. 8 is a plan view illustrating a conductor pattern at a terminal portion of a flexure. The fourth embodiment is similar to the first embodiment, and therefore, like parts are represented with like reference numerals plus "D" in FIG. 8 instead of "A" of FIG. 5 to omit overlapping explanations.

According to the fourth embodiment, an easily extensible part 40D of the flexure 1D has a slit 39D and long holes 41.

The long holes 41 are formed in a wide part 35D between the slit 39D and parallel sides 35Da of the wide part 35D and linearly extend in parallel with the sides 35Da. A first end of each long hole 41 is present between an edge 23Da of an opening 23D and an edge 11Daa of a window 11Da of a support layer of the flexure 1D and extends in parallel with an end part of the slit 39D. A second end of each long hole 41 crosses the edge 11Daa of the window 11Da. The lengths of the slit 39D and long holes 41 are optional. Each long hole 41 is wider than the slit 39D.

According to the fourth embodiment, the long holes 41 divide the wide part 35D into sections between the long holes 41 and the slit 39D and sections between the long holes 41 and the parallel sides 35Da. This configuration allows a part between each flying lead 9Da and each wide part 35D to extend, as well as allowing the wide part 35D to extend, thereby improving reliability of bonding between the flying leads 9Da and external terminals of an external circuit board when they are connected to each other with ultrasonic waves.

In addition, the fourth embodiment provides the same effects as the first embodiment.

Figure 9:
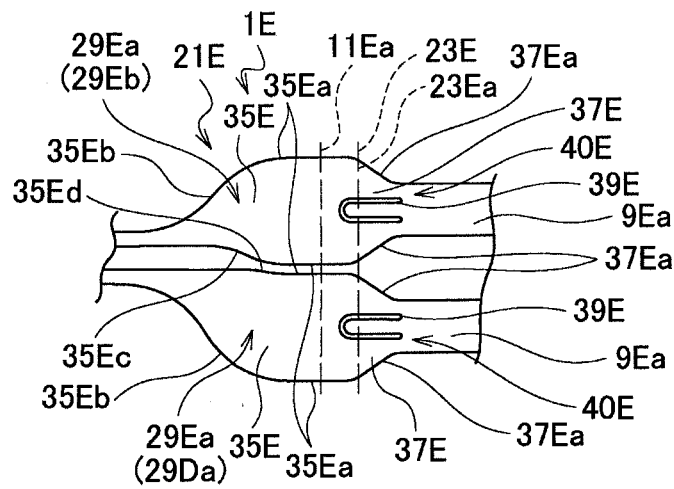
FIG. 9 is a plan view illustrating a conductor pattern at a terminal portion of a flexure according to a fifth embodiment of the present invention.

A fifth embodiment of the present invention will be explained with reference to FIG. 9. FIG. 9 is a plan view illustrating a conductor pattern at a terminal portion of a flexure. The fifth embodiment is similar to the third embodiment, and therefore, like parts are represented with like reference numerals plus "E" in FIG. 9 instead of "C" of FIG. 7 to omit overlapping explanations.

According to the fifth embodiment, the flexure 1E has an easily extensible part 40E including a U-shaped slit 39E that has two linear sections whose ends in a wide part 35E are connected to each other into a U-shape. The length of the U-shaped slit 39E is optional.

The fifth embodiment allows a part between a flying lead 9Ea and the wide part 35E to surely and easily extend, thereby improving reliability of bonding between the flying leads 9Ea and external terminals of an external circuit board when they are connected to each other with ultrasonic waves.

In addition, the fifth embodiment provides the same effects as the third embodiment.

Figure 10:
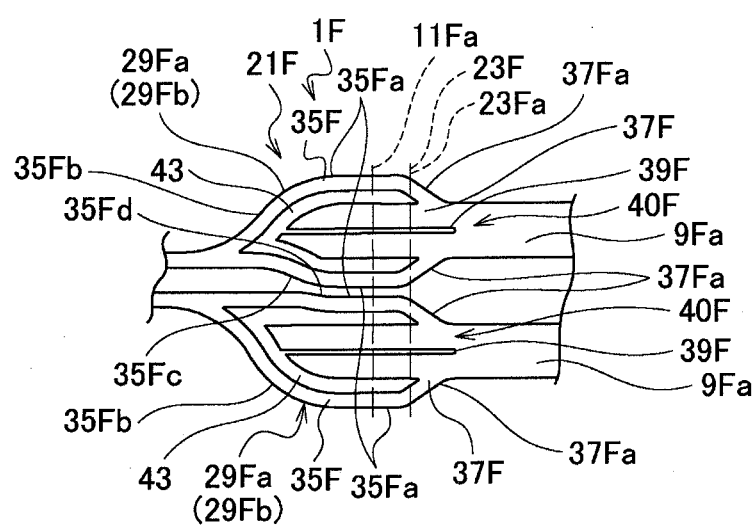
FIG. 10 is a plan view illustrating a conductor pattern at a terminal of a flexure according to a sixth embodiment of the present invention.

A sixth embodiment of the present invention will be explained with reference to FIG. 10. FIG. 10 is a plan view illustrating a conductor pattern at a terminal portion of a flexure. The sixth embodiment is similar to the first embodiment, and therefore, like parts are represented with like reference numerals plus "F" in FIG. 10 instead of "A" of FIG. 5 to omit overlapping explanations.

According to the sixth embodiment, an easily extensible part 40F of the flexure 1F has a slit 39F whose end in a wide part 35F is extended nearly entirely along the wide part 35F to continue a long hole 43. The long hole 43 wider than the slit 39F extends along parallel sides 35Fa and curved sides 35Fb and 35Fc (35Fd) of the wide part 35F. The end of the slit 39F is open and continuous to the long hole 43. The total width of parts of the wide part 35F serving as a conductor is set to be nearly equal to the width of a flying lead 9Fa.

According to the sixth embodiment, the wide part 35F is hollowed with the slit 39F and long hole 43 along the parallel sides 35Fa and curved sides 35Fb and 35Fc (35Fd), so that the total width of parts of the wide part 35F serving as a conductor is nearly equal to the width of the flying lead 9Fa. This configuration prevents a disturbance of electric characteristics.

The end of the slit 39F may not be open to the long hole 43 and the length of the slit 39F is optional.

In addition, the sixth embodiment provides the same effects as the first embodiment.

Figure 11:
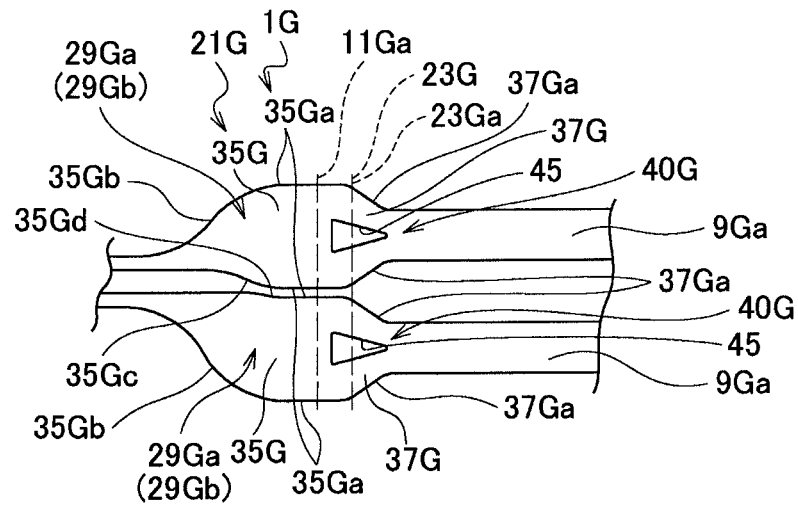
FIG. 11 is a plan view illustrating a conductor pattern at a terminal portion of a flexure according to a seventh embodiment of the present invention.

A seventh embodiment of the present invention will be explained with reference to FIG. 11. FIG. 11 is a plan view illustrating a conductor pattern at a terminal portion of a flexure. The seventh embodiment is similar to the first embodiment, and therefore, like parts are represented with like reference numerals plus "G" in FIG. 11 instead of "A" of FIG. 5 to omit overlapping explanations.

According to the seventh embodiment, an easily extensible part 40G of the flexure 1G has a triangular hole 45 instead of the slit 39 of the first embodiment. The triangular hole 45 is oriented toward a flying lead 9Ga so that the vertex of the triangular hole 45 where oblique sides with respect to a longitudinal direction meet reaches a portion of the flying lead 9Ga adjoining the torsion restrictor 29Ga. The total width of conductive parts on each side of the triangular hole 45 is set to be substantially equal to the width of the flying lead 9Ga.

According to the seventh embodiment, the triangular hole 45 allows a part between the flying lead 9Ga and a wide part 35G to surely extend, thereby improving reliability of bonding between the flying leads 9Ga and external terminals of an external circuit board when they are connected to each other with ultrasonic waves.

The width of a linking part 37G is maintained on each side of the triangular hole 45, to surely disperse torsional torque transferred from the flying lead 9Ga.

The total width of the conductive parts on both sides of the triangular hole 45 is substantially equal to the width of the flying lead 9Ga, to prevent a disturbance of electric characteristics.

In addition, the seventh embodiment provides the same effects as the first embodiment.

Figure 12:
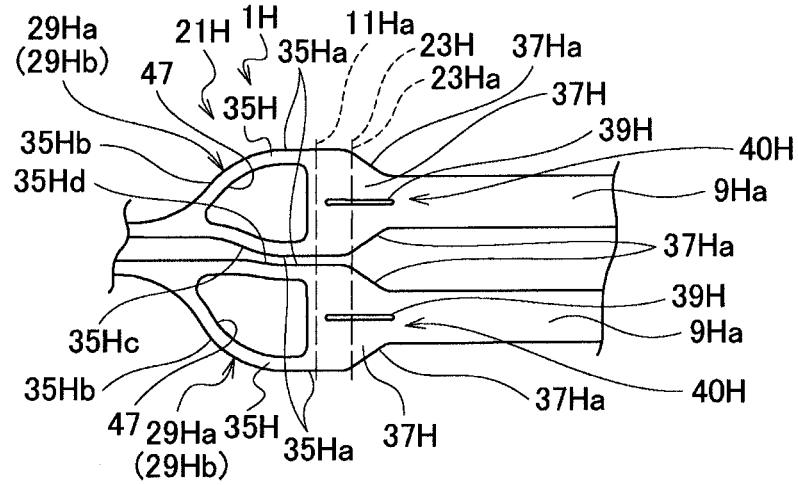
FIG. 12 is a plan view illustrating a conductor pattern at a terminal portion of a flexure according to an eighth embodiment of the present invention.

A eighth embodiment of the present invention will be explained with reference to FIG. 12. FIG. 12 is a plan view illustrating a conductor pattern at a terminal portion of a flexure. The eighth embodiment is similar to the first embodiment, and therefore, like parts are represented with like reference numerals plus "H" in FIG. 12 instead of "A" of FIG. 5 to omit overlapping explanations.

According to the eighth embodiment, an easily extensible part 40H of the flexure 1H has, in addition to a slit 39H, a relatively-large hollow 47 at a location where a wide part 35H overlaps a support layer of the flexure 1H. The total width of conductive parts on each side of the hollow 47 is set to be nearly equal to the width of a flying lead 9Ha.

The hollow 47 formed at the location where the wide part 35H overlaps the support layer is large to minimize an increase in capacitance.

The total width of the conductive parts on each side of the hollow 47 is substantially equal to the width of the flying lead 9Ha, to prevent a disturbance of electric characteristics.

In addition, the eighth embodiment provides the same effects as the first embodiment.

Figure 13:
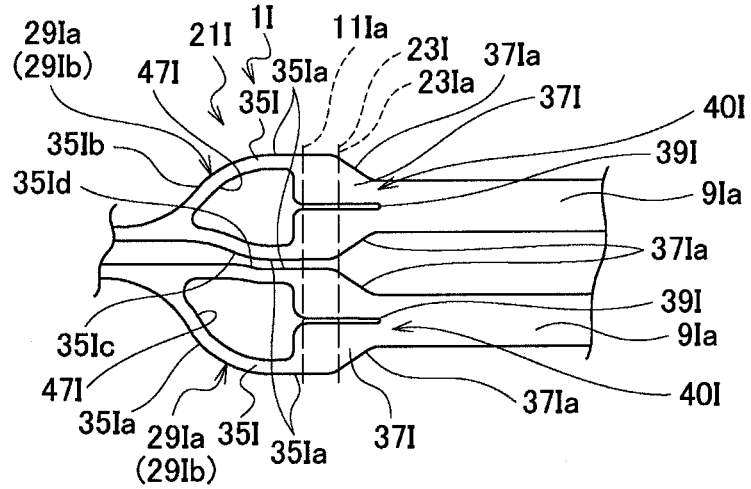
FIG. 13 is a plan view illustrating a conductor pattern at a terminal portion of a flexure according to a ninth embodiment of the present invention.

A ninth embodiment of the present invention will be explained with reference to FIG. 13. FIG. 13 is a plan view illustrating a conductor pattern at a terminal portion of a flexure. The ninth embodiment is similar to the eighth embodiment, and therefore, like parts are represented with like reference numerals plus "I" in FIG. 13 instead of "H" of FIG. 12 to omit overlapping explanations.

According to the ninth embodiment, an easily extensible part 40I of the flexure 1I has a slit 39I and a hollow 47I like the eighth embodiment. In addition, an end of the slit 39I is open and continuous to the hollow 47I.

The ninth embodiment provides the same effects as the eighth embodiment.

Figure 14:
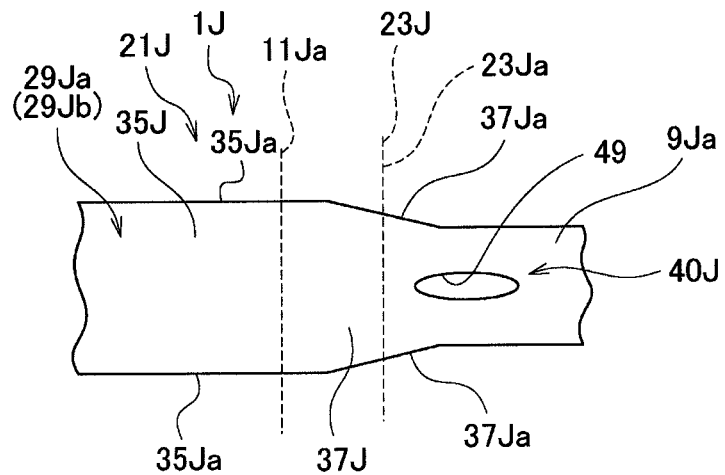
FIG. 14 is a plan view illustrating a conductor pattern at a terminal portion of a flexure according to a tenth embodiment of the present invention.

A tenth embodiment of the present invention will be explained with reference to FIG. 14. FIG. 14 is a plan view illustrating a conductor pattern at a terminal of a flexure according to the tenth embodiment of the present invention. The tenth embodiment is similar to the first embodiment, and therefore, like parts are represented with like reference numerals plus "J" in FIG. 14 instead of "A" of FIG. 5 to omit overlapping explanations.

According to the tenth embodiment, an easily extensible part 40J of the flexure 1J has a long hole 49 between a torsion restrictor 29Ja (29Jb) and a terminal 9Ja. The long hole 49 has a long ellipse shape and is wider than the slit 39 of the first embodiment.

The torsion restrictor 29Ja (29Jb) is symmetrical with respect to a longitudinal center line. A linking part 37J has linear inclined sides 37Ja that extend between an end of the long hole 49 and a window 11Ja.

According to the tenth embodiment, the long hole 49 allows a part between the torsional restrictor 29Ja (29Jb) and the terminal 9Ja to extend toward an opening 23J, thereby providing the same effects as the first embodiment.

Figure 15:
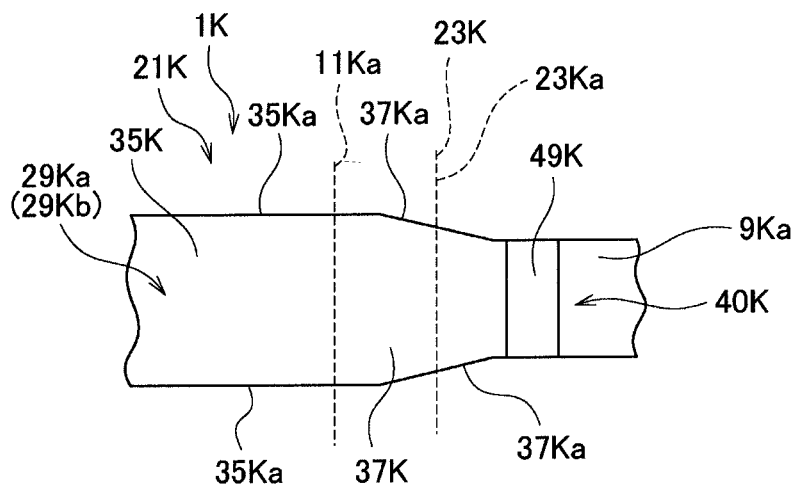
FIG. 15 is a plan view illustrating a conductor pattern at a terminal portion of a flexure according to an eleventh embodiment of the present invention.

A eleventh embodiment of the present invention will be explained with reference to FIG. 15. FIG. 15 is a plan view illustrating a conductor pattern at a terminal portion of a flexure. The eleventh embodiment is similar to the tenth embodiment, and therefore, like parts are represented with like reference numerals plus "K" in FIG. 15 instead of "J" of FIG. 14 to omit overlapping explanations.

According to the eleventh embodiment, an easily extensible part 40K of the flexure 1K has a relative thinned part 49K formed on a portion of a terminal 9Ka adjoining a torsion restrictor 29Ka (29Kb), i.e., formed between the torsion restrictor 29Ka (29Kb) and the terminal 9Ka other than the thinned part 49K. The thinned part 49K is formed by partial etching.

According to the eleventh embodiment, the thinned part 49K allows a part between the torsional restrictor 29Ka (29Kb) and the terminal 9Ka to extend toward an opening 23K, thereby providing the same effects as the tenth embodiment.

Figure 16:
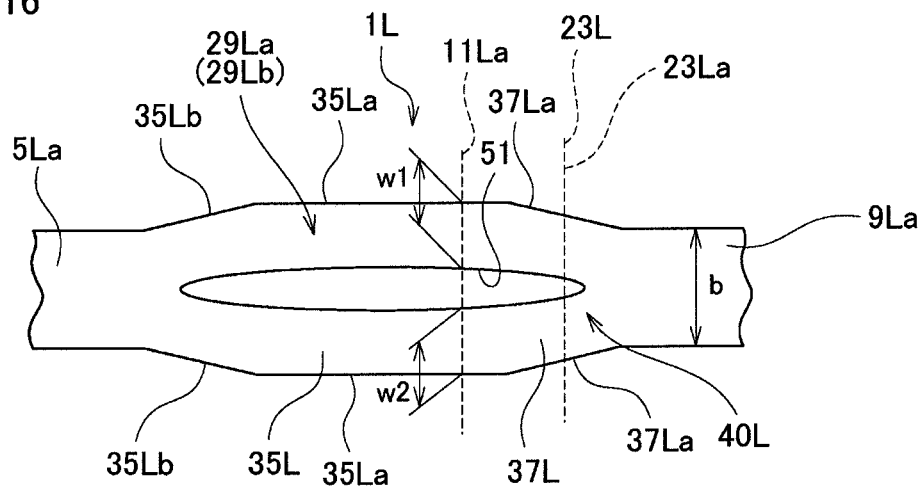
FIG. 16 is a plan view illustrating a conductor pattern at a terminal portion of a flexure according to a twelfth embodiment of the present invention.

A twelfth embodiment of the present invention will be explained with reference to FIG. 16. FIG. 16 is a plan view illustrating a conductor pattern at a terminal portion of a flexure. The twelfth embodiment is similar to the tenth embodiment, and therefore, like parts are represented with like reference numerals plus "L" in FIG. 16 instead of "J" of FIG. 14 to omit overlapping explanations.

According to the twelfth embodiment, an easily extensible part 40L of the flexure 1L has a long hole 51 in a torsion restrictor 29La (29Lb). The long hole 51 has a long ellipse shape and is wider than the slit 39 of the first embodiment. A first end of the long hole 51 reaches a portion of a linking part 37L inside an opening 23L and a second end thereof is positioned between inclined sides 35Lb of a wide part 35L. The inclined sides 35Lb are continuous to a wire 5La. Each of other wires of the wiring pattern 9L is provided with the same configuration.

The wide part 35L has conductive parts having widths of W1 and W2 that are equal to each other. The widths W1 and W2 and a width b of a flying lead 9La are set to satisfy "W1+W2>b".

The twelfth embodiment suppresses a disturbance of electric characteristics, secures the total width of the torsion restrictor 29La (29Lb) to improve torsional rigidity, and maintains strength by setting "W1+W2>b". In addition, the twelfth embodiment provides the same effects as the tenth embodiment.

In each of the embodiments, the support layer made of metal such as stainless steel may be omitted.

The present invention is applicable not only to flexures but also to other types of wiring substrates.

What is claimed is:

1. A wiring substrate comprising:
   a conductor pattern embedded in an insulating layer, the insulating layer having an opening to expose top and bottom faces of the conductor pattern and define a terminal of the wiring substrate;
   a torsion restrictor formed in the conductor pattern at a location passing over an edge of the opening, the torsion restrictor restricting torsion of the terminal; and
   an easily extensible part formed on at least one of the torsion restrictor and a portion of the terminal adjoining the torsion restrictor, the easily extensible part allowing the conductor pattern to longitudinally extend toward the opening.

2. The wiring substrate of claim 1, wherein the torsion restrictor includes a linking part that gradually widens from the terminal and a wide part that is continuous to the linking part.

3. The wiring substrate of claim 1, wherein the easily extensible part includes any one of a slit, a hole, and a combination thereof to split the torsion restrictor in a lateral direction orthogonal to a longitudinal direction of the conductor pattern.

4. The wiring substrate of claim 1, wherein the torsion restrictor includes a linking part that gradually widens from the terminal and a wide part that is continuous to the linking part,
   the easily extensible part includes a hole to split the torsion restrictor in a lateral direction orthogonal to a longitudinal direction of the conductor pattern, and
   a conductor width at the wide part is greater than a conductor width at the terminal.

5. The wiring substrate of any one of claim 1, wherein the easily extensible part includes any one of a slit, a hole, and a thinned part formed on the portion of the terminal adjoining the torsion restrictor.

6. The wiring substrate of claim 1, wherein the insulating layer is supported with a metal support layer and the metal support layer has a window to expose the opening.

7. The wiring substrate of claim 6, wherein the torsion restrictor includes a hollow that is formed through the metal support layer at a part where the torsion restrictor overlaps the metal support layer to minimize an increase in capacitance.

8. The wiring substrate of claim 1, wherein the wiring substrate is a flexure of a head suspension and the conductor pattern serves as a wiring pattern for a read/write head of the flexure.

* * * * *